United States Patent
Chiang et al.

(10) Patent No.: US 8,981,540 B2
(45) Date of Patent: Mar. 17, 2015

(54) ELECTRONIC DEVICE AND PACKAGE STRUCTURE THEREOF

(71) Applicant: Siliconware Precision Industries Co., Ltd., Taichung (TW)

(72) Inventors: Cheng-Yu Chiang, Taichung Hsien (TW); Wen-Jung Chiang, Taichung Hsien (TW); Hsing-Hung Lee, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/922,904

(22) Filed: Jun. 20, 2013

(65) Prior Publication Data

US 2014/0225241 A1  Aug. 14, 2014

(30) Foreign Application Priority Data

Feb. 8, 2013 (TW) .............................. 102105161 A

(51) Int. Cl.
*H01L 23/495* (2006.01)
(52) U.S. Cl.
CPC ..... *H01L 23/495* (2013.01); *H01L 2224/32245* (2013.01); *H01L 2224/48247* (2013.01); *H01L 2224/49109* (2013.01); *H01L 2224/73265* (2013.01)

USPC .......... 257/676; 257/670; 257/668; 257/690; 257/691; 257/692; 257/693; 257/E23.037; 257/E23.052

(58) Field of Classification Search
USPC .......... 257/666–734, E23.031–E23.059, 773, 257/796, E23.001–E23.194
See application file for complete search history.

(56) References Cited

U.S. PATENT DOCUMENTS

| | | | | |
|---|---|---|---|---|
| 5,834,832 | A | * 11/1998 | Kweon et al. | 257/676 |
| 2003/0001289 | A1* | 1/2003 | Yamada et al. | 257/783 |
| 2008/0286901 | A1* | 11/2008 | Khor et al. | 438/112 |

* cited by examiner

*Primary Examiner* — Jasmine Clark
(74) *Attorney, Agent, or Firm* — Mintz Levin Cohn Ferris Glovsky and Popeo, P.C.; Peter F. Corless; Steven M. Jensen

(57) ABSTRACT

A package structure is disclosed, which includes: a carrier having a recessed portion formed on a lower side thereof and filled with a dielectric material; a semiconductor element disposed on an upper side of the carrier and electrically connected to the carrier; and an encapsulant formed on the upper side of the carrier for encapsulating the semiconductor element. Therein, the dielectric material is exposed from the encapsulant. As such, when the carrier is disposed on a circuit board, the dielectric material is sandwiched between the lower side of the carrier and the circuit board to form a decoupling capacitor, thereby improving the power integrity.

22 Claims, 4 Drawing Sheets

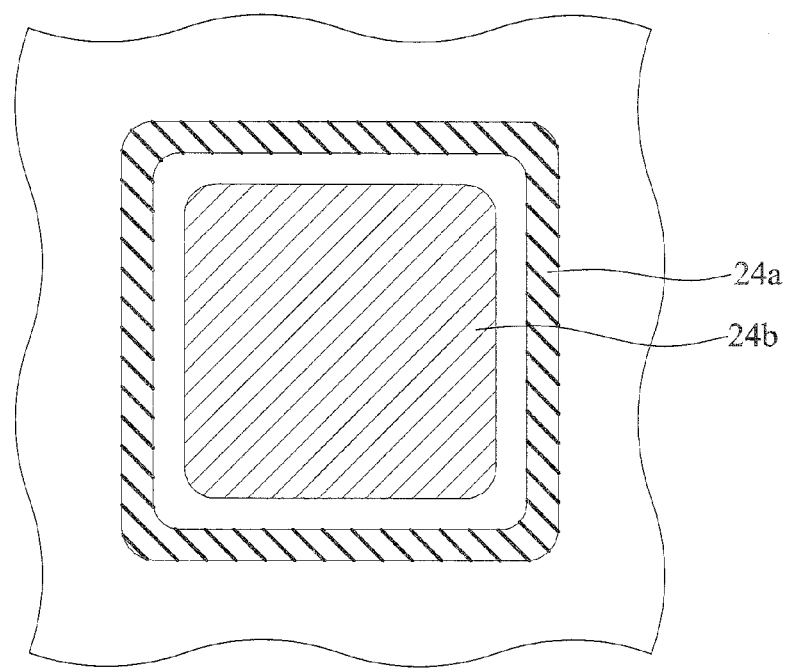
FIG.2C'
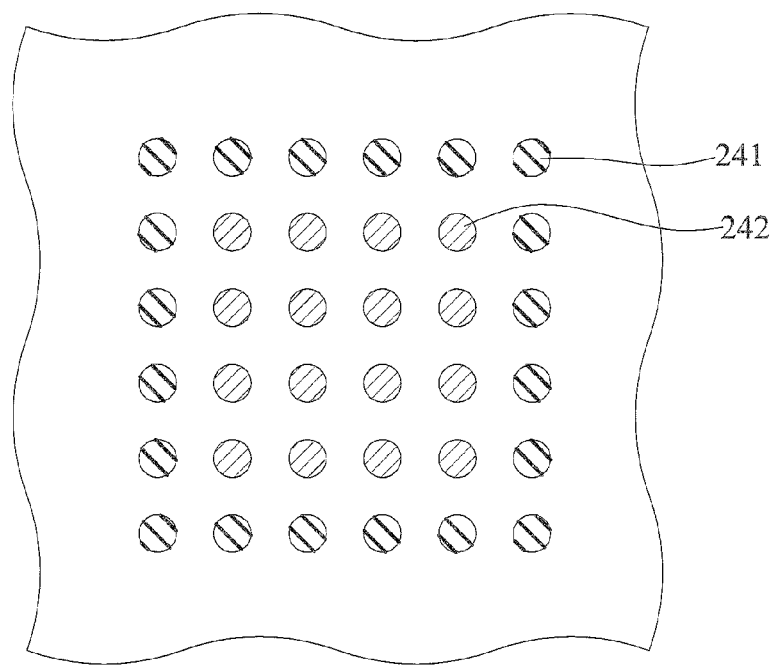
FIG.2C"

ELECTRONIC DEVICE AND PACKAGE STRUCTURE THEREOF

CROSS-REFERENCES TO RELATED APPLICATIONS

This application claims under 35 U.S.C. §119(a) the benefit of Taiwanese Application No. 102105161, filed Feb. 8, 2013, the entire contents of which is in incorporated herein by reference.

BACKGROUND OF THE INVENTION

1. Field of the Invention

The present invention relates to package structures, and more particularly, to an electronic device and a package structure thereof for improving power integrity.

2. Description of Related Art

Along with the progress of semiconductor processes, integrated circuits have been designed to operate at lower voltage and higher speed. Accordingly, power integrity has become a concern in IC packages. As the number of switches in a chip continuously increases and the supply voltage of the chip continuously decreases, power fluctuation seriously affects system operation. Therefore, stable and reliable power supplies have become a focus of research and development efforts.

Currently, power integrity is improved through using the decoupling capacitors. Since the conventional QFP (Quad Flat Package) and QFN (Quad Flat No Leads) packages cannot provide decoupling capacitors by themselves, the packages need externally connected decoupling capacitors so as to improve the power integrity.

FIG. 1A is a schematic cross-sectional view of a QFP package structure 1. Referring to FIG. 1A, the QFP package structure 1 has a circuit board 1b having a circuit layer 14, a ground layer 15 and a power layer 16, and a QFP package 1a disposed on the circuit board 1b. The QFP package 1a has a lead frame 10 having a die attach pad 101 and a plurality of leads 102, a semiconductor element 11 disposed on the die attach pad 101 and electrically connected to the leads 102 through a plurality of bonding wires 110, and an encapsulant 12 encapsulating the semiconductor element 11. The circuit layer 14 is formed at the outermost side of the circuit board 1b and has a ground pad 14a and a power pad 14b. The ground pad 14a is electrically connected to the ground layer 15 through a plurality of conductive through holes 141, and the power pad 14b is electrically connected to the power layer 16 through a plurality of conductive through holes 143. Further, the leads 102 are electrically connected to the power pad 14b.

FIG. 1B is a schematic cross-sectional view of a conventional QFN package structure 1'. Referring to FIG. 1B, the QFN package structure 1' has a circuit board 1b having a circuit layer 14, a ground layer 15 and a power layer 16, and a QFN package 1a' disposed on the circuit board 1B. The package 1a' has a lead frame 10' having a die attach pad 101 and a plurality of leads 102', a semiconductor element 11 disposed on the die attach pad 101 and electrically connected to the leads 102' through a plurality of bonding wires 110, and an encapsulant 12 encapsulating the semiconductor element 11. In the QFN package structure 1', the leads 102' do not extend out from the package sides and the bottoms of the leads 102' provide electrical connections to the circuit board 1b. The circuit layer 14 is formed at the outermost side of the circuit board 1b and has a ground pad 14a and a power pad 14b. The ground pad 14a is electrically connected to the ground layer 15 through a plurality of conductive through holes 141 and the power pad 14b is electrically connected to the power layer 16 through a plurality of conductive through holes 143. Further, the leads 102' are electrically connected to the power pad 14b.

However, referring to FIG. 1C, the conventional package structure 1, 1' has a parasitic inductor L and a parasitic resistor R connected in series between the power and ground terminals. When the impedance of the parasitic inductor L increases with frequency, the impedance Z between the power and ground terminals also increases. As such, an IR drop or a ground bounce may be generated between the power and ground terminals and adversely affect the power integrity of the package structure.

To improve the power integrity, the package structure 1, 1' needs at least an externally connected decoupling capacitor (not shown). The decoupling capacitor is generally mounted to the package structure through a SMT (Surface Mounted Technology) process. As such, the material cost and the fabrication cost are increased due to the decoupling capacitor and its SMT process.

Furthermore, the externally connected decoupling capacitor has another parasitic inductor (not shown) and another parasitic resistor (not shown), which increases the electrical loop between the power and ground terminals. In addition, the equivalent series resistance (ESR) and the equivalent series inductance (ESL) of the decoupling capacitor are large. Therefore, the package structure cannot achieve a high performance.

Therefore, how to overcome the above-described drawbacks has become urgent.

SUMMARY OF THE INVENTION

In view of the above-described drawbacks, the present invention provides a package structure, which comprises: a carrier having a first side and a second side opposite to the first side, wherein a recessed portion is formed on the second side of the carrier and filled with a dielectric material; a semiconductor element disposed on the first side of the carrier and electrically connected to the carrier; and an encapsulant formed on the first side of the carrier for encapsulating the semiconductor element, wherein the dielectric material is exposed from the encapsulant.

The present invention further provides an electronic device, which comprises: a circuit board having a power pad; a carrier having opposite first and second sides and disposed on and electrically connected to the circuit board via the second side thereof, wherein the carrier has a recessed portion formed on the second side thereof and filled with a dielectric material, and the carrier is disposed on the circuit board in a manner that the dielectric material is sandwiched between the carrier and the power pad such that the carrier, the dielectric material and the power pad form a capacitor; a semiconductor element disposed on the first side of the carrier and electrically connected to the carrier; and an encapsulant formed on the first side of the carrier for encapsulating the semiconductor element.

In the above-described electronic device, the circuit board can comprise a circuit layer having the power pad, a ground layer and a power layer. Therein, the circuit layer is formed at the outermost side of the circuit board and has a ground pad electrically connected to the ground layer, the power pad, and a plurality of conductive pads, allowing the conductive pads to be electrically connected to the power layer.

In the above-described electronic device and package structure, the carrier can be a lead frame that has a die attach pad and a plurality of leads around the die attach pad. The semiconductor element is disposed on the first side of the die attach pad and electrically connected to the leads by wire bonding, and the dielectric material is sandwiched between the die attach pad and the power pad such that the die attach pad, the dielectric material and the power pad form a capacitor. The recessed portion is formed on the second side of the die attach pad. The second side of the die attach pad protrudes from the encapsulant. The semiconductor element is electrically connected to the leads through a plurality of bonding wires and grounded to the die attach pad through at least one bonding wire. Each of the leads can have a step portion.

In the above-described electronic device and package structure, a groove can be formed on the second side of the carrier around an outer periphery of the recessed portion. The dielectric material can be flush with the second side of the carrier. The permittivity of dielectric material can be greater than 4.

According to the present invention, a recessed portion is formed on the second side of a carrier and filled with a dielectric material such that when the carrier is disposed on a circuit board, the circuit board, the dielectric material and the carrier form a decoupling capacitor. Therefore, the present invention dispenses with an externally connected decoupling capacitor as in the prior art so as to effectively reducing the cost. Further, the power integrity is improved through the decoupling capacitor.

Furthermore, the invention prevents the grounding path of the package structure from being adversely affected by an externally connected decoupling capacitor as in the prior art. Compared with the prior art, the package structure has a shorter electrical loop and the equivalent series resistance and the equivalent series inductance of the decoupling capacitor of the present invention are smaller, thus improving the performance of the package structure.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "first", "second", "a" etc. are merely for illustrative purposes and should not be construed to limit the scope of the present invention.

Figure 1A:
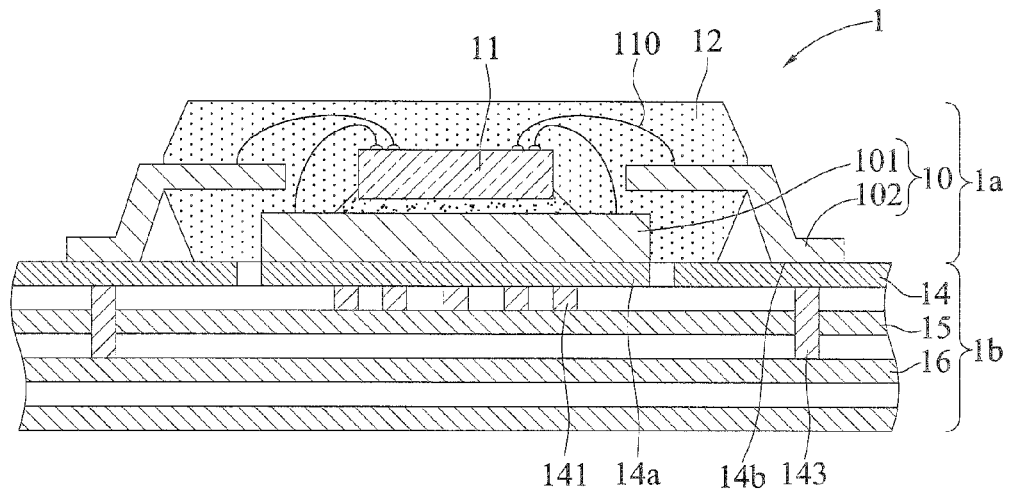
FIGS. 1A and 1B are schematic cross-sectional views of conventional package structures.
Figure 1B:
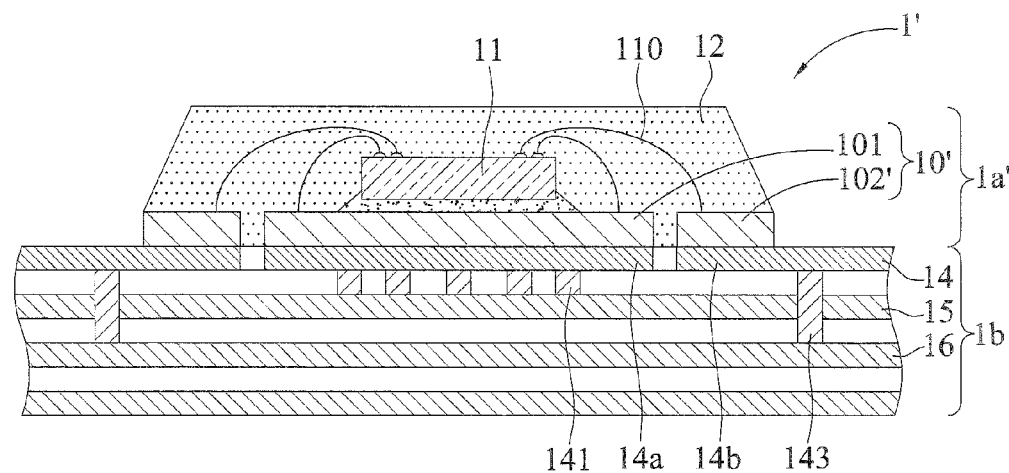
Figure 1C:
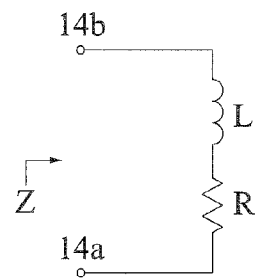
FIG. 1C is a schematic circuit diagram of a conventional package structure.
Figure 2A:
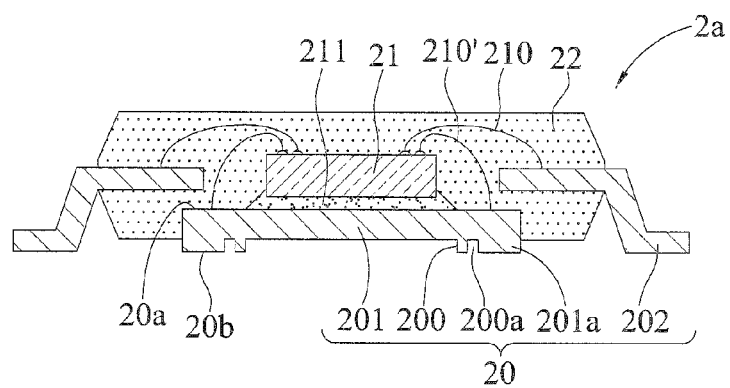
FIGS. 2A to 2C are schematic cross-sectional views showing a fabrication method of an electronic device according to the present invention, wherein FIGS. 2C' and 2C" are partially enlarged upper views of the structure of FIG. 2C.
Figure 2B:
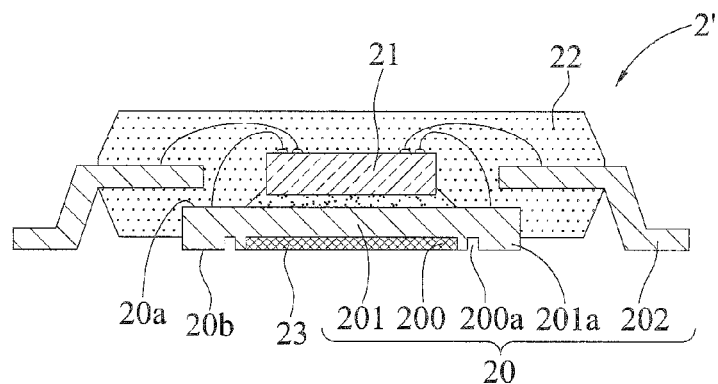
Figure 2C:
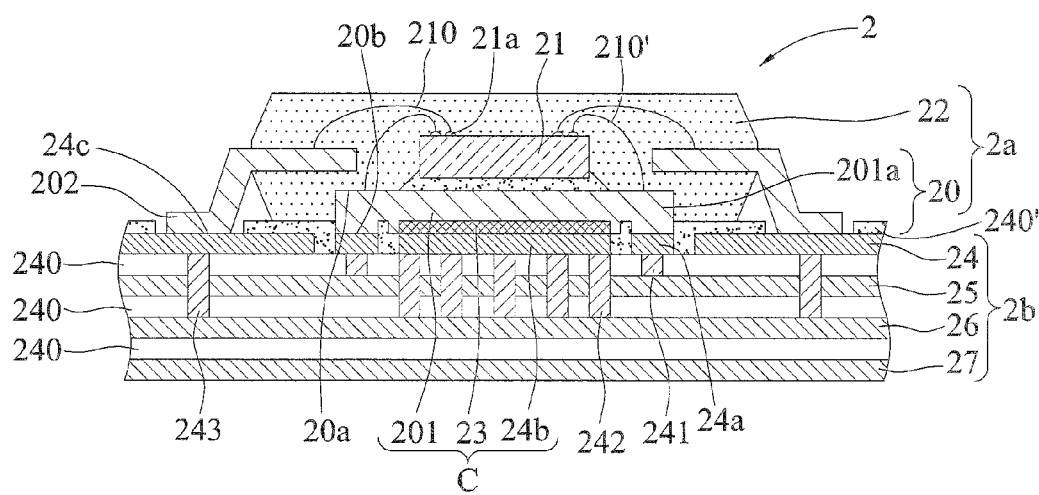

FIGS. 2A to 2C are schematic cross-sectional views showing a fabrication method of an electronic device 2 according to the present invention.

Referring to FIG. 2A, a semiconductor package 2a is shown, which has a carrier 20 having a first side 20a, i.e., an upper side, and a second side 20b, i.e., a lower side, opposite to the first side 20a; a semiconductor element 21 disposed on the first side 20a of the carrier 20; and an encapsulant 22 encapsulating the semiconductor element 21. The second side 20b of the carrier 20 has a recessed portion 200.

In the present embodiment, the carrier 20 is a lead frame that has a die attach pad 201 and a plurality of leads 202 around the die attach pad 201. The lead frame can be made of a metal material such as copper. The second side 20b of the die attach pad 201 protrudes from the encapsulant 22. The semiconductor element 21 is attached to the first side 20a of the die attach pad 201 through an adhesive layer 211 and electrically connected to the leads 202 through a plurality of bonding wires 210 and grounded to the die attach pad 201 through at least one bonding wire 210'. The semiconductor package 2a is subject to a QFN package.

The recessed portion 200 is formed on the second side 20b of the die attach pad 201 by etching.

Further, a groove 200a is formed on the second side 20b of the die attach pad 201 around an outer periphery of the recessed portion 200, and a connection portion 201a is formed around an edge of the die attach pad 201. The groove 200a can receive overflowed encapsulant 22 so as to protect the package from being contaminated by the overflowed encapsulant 22. Alternatively, an adhesive film (not shown) can be attached to the lower side of the carrier 20 before the process of forming the encapsulant 22 and removed after the encapsulant 22 is formed. As such, the package is protected by the adhesive film from being contaminated by overflowed encapsulant.

Referring to FIG. 2B, a dielectric material 23 is formed in the recessed portion 200 and the dielectric material 23 is flush with the second side 20b of the die attach pad 201, thereby forming a package structure 2'.

In the present embodiment, the dielectric material 23 is a high-k dielectric material. Preferably, the permittivity of dielectric material 23 is greater than 4.

Overflowed dielectric material 23 can be received in the groove 200a so as not to contaminate the connection portion 201a, thereby ensuring a reliably electrical connection quality of the connection portion 201a.

Referring to FIG. 2C, the carrier 20 is disposed on a circuit board 2b in a manner that the dielectric material 23 is sandwiched between the die attach pad 201 and the circuit board 2b, thus forming an electronic device 2.

Further, the circuit board 2b has a circuit layer 24 and an insulating layer 240' sequentially formed on an upper surface thereof and a circuit layer 27 formed on a lower surface thereof. Further, a ground layer 25 and a power layer 26 are formed inside the circuit board 2b in a manner that an insulating layer 240 is sandwiched between the ground layer 25 and the power layer 26. Portions of the circuit layer 24 are exposed from the insulating layer 240' to respectively serve as a ground pad 24a, a power pad 24b and a plurality of conductive pads 24c. The connection portion 201a is in contact with the ground pad 24a, and the ground pad 24a is electrically connected to the ground layer 25 through a plurality of first conductive through holes 241. The dielectric material 23 is in contact with the power pad 24b, and the power pad 24b is electrically connected to the power layer 26 through a plurality of second conductive through holes 242. The leads are in electrical contact with the conductive pads 24c and the conductive pads 24c are electrically connected to the power layer 26 through a plurality of third conductive through holes 243.

The dielectric layer 23 is sandwiched between the die attach pad 201 and the power pads 24b such that the die attach pad 201, the dielectric material 23 and the power pad 24b form a decoupling capacitor C.

The power layer 26 is electrically connected to electrode pads 21a of the semiconductor element 21 through the third conductive through holes 243, the conductive pads 24c and the leads 202, thereby providing an electrical conductive path. The semiconductor element 21 is further electrically connected to the ground layer 25 through the bonding wires 210', the die attach pad 201 having the connection portion 201a, the ground pad 24a and the first conductive through holes 241, thereby providing a grounding path.

Since the connection portion 201a is in contact with the ground pad 24a and the dielectric material 23 is in contact with the power pad 24b, the die attach pad 201 is electrically isolated from the power pad 24b. Further, the ground pad 24a and the power pad 24b are located under the die attach pad 201 and arranged in a manner that the power pad 24b is surrounded by the ground pad 24a, as shown in FIG. 2C'. The first and second conductive through holes 241, 241 are arranged corresponding in position to the ground pad 24a and the power pad 24b, respectively, as shown in FIG. 2C''.

According to the present invention, the package structure 2' has a recessed portion 200 formed on the second side 20b of the die attach pad 201 and filled with the dielectric material 23 such that when the package structure 2' is disposed on the circuit board 2b, a decoupling capacitor C can be formed between the die attach pad 201 and the circuit board 2b without adversely affecting the grounding path.

Figure 2D:
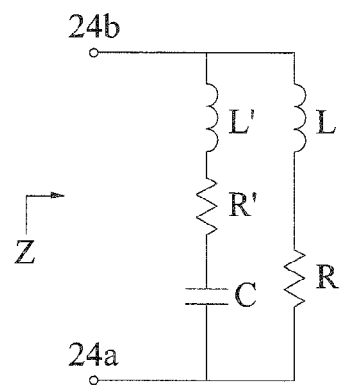
FIG. 2D is a schematic circuit diagram of a package structure of the present invention.

Referring to FIG. 2D, the decoupling capacitor C is designed to be equivalently connected in parallel with the parasitic inductor L and the parasitic resistor R between the power and ground terminals. As such, based on the characteristic of the decoupling capacitor C that its impedance ($Z'=1/\omega C$) decreases as frequency increases, the impedance Z between the power and ground terminals can be reduced, thereby preventing IR drops and ground bounces from occurring so as to improve the power integrity.

Further, by forming the decoupling capacitor C between the semiconductor package 1a and the circuit board 2b, the present invention dispenses with an externally connected decoupling capacitor as in the prior art, thereby reducing the material cost and the fabrication cost.

Furthermore, the invention prevents the grounding path of the package structure from being adversely affected by an externally connected decoupling capacitor as in the prior art. Therefore, a shorter electrical loop is formed between the ground pad 24a and the power pad 24b and the decoupling capacitor C has a smaller equivalent series resistance R' and a smaller equivalent series inductance L', thereby improving the performance of the package structure.

Figure 3:
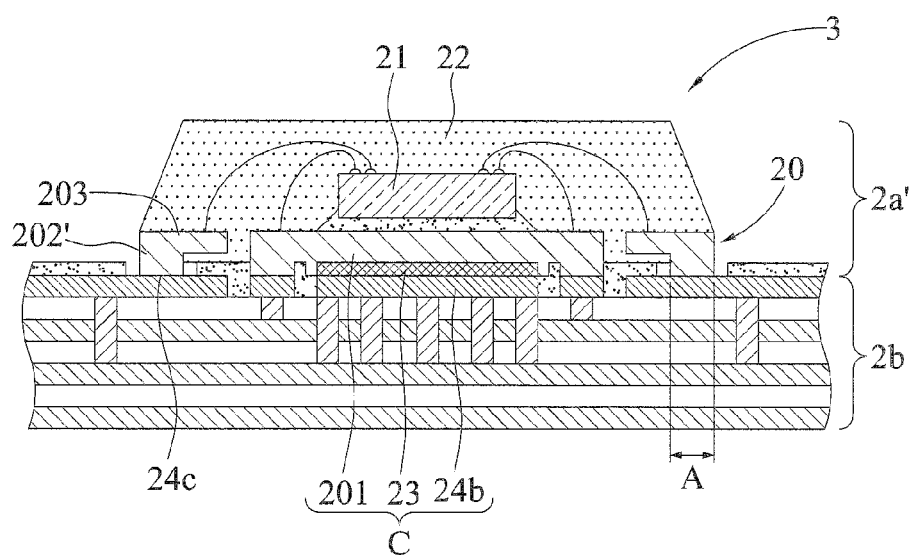
FIG. 3 is a schematic cross-sectional view of a package structure according to another embodiment of the present invention.

FIG. 3 shows a package structure 3 according to another embodiment of the present invention. The package structure 3 has a QFN type semiconductor package 2a'. That is, the leads 202' of the semiconductor package 2a' do not extend out from the package sides. Therefore, the QFN semiconductor package 2a' is small in size. Consequently, the size of the package structure 3 can be correspondingly reduced, the circuit density of the circuit board 2b can be increased, or more packages can be disposed on the circuit board 2b. Preferably, each of the leads 202' has a step portion 203 so as to increase the bonding area between the lead 202' and the encapsulant 22, thereby strengthening the bonding between the lead 202' and the encapsulant 22 and preventing delamination of the lead 202' from the encapsulant 22. On the other hand, the bottom area A of the lead 202' (i.e., the contact area between the lead 202' and the corresponding conductive pad 24c) can be reduced to increase the circuit density of the circuit board 2b.

The package structure 2', 3 of the present invention has: a carrier 20 having a first side 20a and a second side 20b opposite to the first side 20a; a semiconductor element 21 disposed on the first side 20a of the carrier 20 and electrically connected to the carrier 20; and an encapsulant 22 formed on the first side 20a of the carrier 20 for encapsulating the semiconductor element 21.

A recessed portion 200 is formed on the second side 20b of the carrier 20 and filled with a dielectric material 23. Preferably, the dielectric material 23 is flush with the second side 20b of the carrier 20. The dielectric material 23 is exposed from the encapsulant 22.

In an embodiment, the carrier 20 is a lead frame that has a die attach pad 201 and a plurality of leads 202, 202' around the die attach pad 201. The recessed portion 200 is formed on the second side 20b of the die attach pad 201, and the semiconductor element 21 is disposed on the first side 20a of the die attach pad 201 and electrically connected to the leads 202, 202' by wire bonding.

The electronic device 2 has the package structure 2', 3 and a circuit board 2b having a power pad 24b.

The carrier 20 is disposed on the circuit board 2b in a manner that the dielectric material 23 is sandwiched between the carrier 20 (or the die attach pad 201) and the circuit board 2b (or the power pad 24b). As such, the carrier 20 (or the die attach pad 201), the dielectric material 23 and the circuit board 2b (or the power pad 24b) form a decoupling capacitor C. The carrier 20 is electrically connected to the circuit board 2b.

In an embodiment, the circuit board 2b has a circuit layer 24 having the power pad 24b, a ground layer 25 and a power layer 26. The circuit layer 24 is formed at the outermost side of the circuit board 2b and has a ground pad 24a electrically connected to the ground layer 25, the power pad 24b, and a plurality of conductive pads 24c. Further, the conductive pads 24c and the power pad 24b are electrically connected to the power layer 26, the leads 202 are electrically connected to the conductive pads 24c, and the die attach pad 201 is grounded to the ground pad 24a.

According to the present invention, a recessed portion is formed on the second side of a carrier and filled with a dielectric material such that when the carrier is disposed on a circuit board, the circuit board, the dielectric material and the carrier form a decoupling capacitor. Therefore, the present invention dispenses with an externally connected decoupling capacitor as in the prior art, thereby effectively reducing the cost. Further, the impedance of the decoupling capacitor facilitates to reduce the impedance between the power and ground pads of the circuit board so as to improve the power integrity.

Further, the invention prevents the grounding path of the package structure from being adversely affected by an externally connected decoupling capacitor as in the prior art. Compared with the prior art, the package structure has a shorter electrical loop and the equivalent series resistance and the equivalent series inductance of the decoupling capacitor of the present invention are smaller, thus improving the performance of the package structure.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
   a carrier having a first side and a second side opposite to the first side, wherein a recessed portion is formed on the second side of the carrier and filled with a dielectric material;
   a semiconductor element disposed on the first side of the carrier and electrically connected to the carrier; and
   an encapsulant formed on the first side of the carrier for encapsulating the semiconductor element, wherein the dielectric material is exposed from the encapsulant.

2. The structure of claim 1, wherein the carrier is a lead frame that has a die attach pad and a plurality of leads around the die attach pad, and wherein the semiconductor element is disposed on the first side of the die attach pad and electrically connected to the leads by wire bonding.

3. The structure of claim 2, wherein the recessed portion is formed on the second side of the die attach pad.

4. The structure of claim 2, wherein the second side of the die attach pad protrudes from the encapsulant.

5. The structure of claim 2, wherein the semiconductor element is electrically connected to the leads through a plurality of bonding wires.

6. The structure of claim 2, wherein the semiconductor element is grounded to the die attach pad through at least one bonding wire.

7. The structure of claim 2, wherein each of the leads has a step portion.

8. The structure of claim 1, wherein a groove is formed on the second side of the carrier around an outer periphery of the recessed portion.

9. The structure of claim 1, wherein the dielectric material is flush with the second side of the carrier.

10. The structure of claim 1, wherein the permittivity of dielectric material is greater than 4.

11. An electronic device, comprising:
    a circuit board having a power pad;
    a carrier disposed on and electrically connected to the circuit board via a second side thereof, wherein the carrier has a recessed portion formed on the second side thereof and filled with a dielectric material, and the dielectric material is filled between the carrier and the power pad such that the carrier, the dielectric material and the power pad form a capacitor;
    a semiconductor element disposed on a first side of the carrier opposite to the second side thereof and electrically connected to the carrier; and
    an encapsulant formed on the first side of the carrier for encapsulating the semiconductor element.

12. The device of claim 11, wherein the circuit board comprises a circuit layer, a ground layer and a power layer, the circuit layer is formed at the outermost side of the circuit board and has a ground pad electrically connected to the ground layer, the power pad, and a plurality of conductive pads, and the conductive pads and the power pad electrically connected to the power layer.

13. The device of claim 12, wherein the carrier is a lead frame that has a die attach pad and a plurality of leads around the die attach pad, the semiconductor element is disposed on the first side of the die attach pad and electrically connected to the leads by wire bonding, and the dielectric material is sandwiched between the die attach pad and the power pad such that the die attach pad, the dielectric material and the power pad form a capacitor.

14. The device of claim 13, wherein the leads are electrically connected to the conductive pads and the die attach pad is grounded to the ground pad.

15. The device of claim 13, wherein the recessed portion is formed on the second side of the die attach pad.

16. The device of claim 13, wherein the second side of the die attach pad protrudes from the encapsulant.

17. The device of claim 13, wherein the semiconductor element is electrically connected to the leads through a plurality of bonding wires.

18. The device of claim 13, wherein the semiconductor element is grounded to the die attach pad through at least one bonding wire.

19. The device of claim 13, wherein each of the leads has a step portion.

20. The device of claim 11, wherein a groove is formed on the second side of the carrier around an outer periphery of the recessed portion.

21. The device of claim 11, wherein the dielectric material is flush with the second side of the carrier.

22. The device of claim 11, wherein the permittivity of dielectric material is greater than 4.

* * * * *